United States Patent [19]

Hope et al.

[11] 4,437,966

[45] Mar. 20, 1984

[54] SPUTTERING CATHODE APPARATUS

[75] Inventors: Lawrence L. Hope, Stow; Ernest A. Davey, Peabody, both of Mass.

[73] Assignee: GTE Products Corporation, Stamford, Conn.

[21] Appl. No.: 431,958

[22] Filed: Sep. 30, 1982

[51] Int. Cl.³ ............................................ C23C 15/00
[52] U.S. Cl. ................................ 204/298; 204/192 R
[58] Field of Search ........................... 204/192 R, 298

[56] References Cited

U.S. PATENT DOCUMENTS

| | | | |
|---|---|---|---|
| 3,779,891 | 12/1973 | Vegh et al. | 204/298 |
| 4,170,541 | 10/1979 | Lamont | 204/298 |
| 4,308,126 | 12/1981 | Wright | 204/298 |
| 4,322,276 | 3/1982 | Meckel et al. | 204/298 |

OTHER PUBLICATIONS

Bertelsen, IBM Technical Disclosure Bulletin, vol. 6, Jul. 1963, pp. 69-70.

*Primary Examiner*—Arthur P. Demers
*Attorney, Agent, or Firm*—Edward J. Coleman

[57] ABSTRACT

A sputtering cathode apparatus for the deposition of thin films which are produced at a relatively high deposition rate. A relatively large planar magnetron sputtering system or apparatus is provided with a preferred single convoluted electron path so as to obtain high geometric efficiency. The target is larger than the substrate and the substrate motion is confined to an area within the defined target area. The cathode system requires a vacuum system of relatively small dimension due to the increase in target size in comparison with substrate size along with the provision for multiple plasma legs separated by non-emissive regions therebetween. This construction enables minimized substrate motion relative to the target.

5 Claims, 5 Drawing Figures

SPUTTERING CATHODE APPARATUS

BACKGROUND OF THE INVENTION

The present invention relates in general to a sputtering cathode apparatus used for the deposition of thin films. More particularly, the invention is concerned with an improved sputtering cathode construction that provides for deposition of uniform films at high deposition rates.

Planar magnetron sputtering is commonly used for the deposition of thin films in both laboratory and production applications. Planar magnetron sputtering permits relatively high deposition rates, limits unwanted substrate bombardment and heating, and is particularly useful for deposition with large flat substrates without requiring planetary tooling or excessively large throw distances. In planar megnetron sputtering, there is established a visible plasma area magnetically confined to a selected region of the target which then becomes the only area with significant emission of sputtered material. The emitting area assumes the form of a closed figure in the target plane.

Economic considerations dictate optimization of sputtering throughput in deposition systems and apparatus. An increase in effective deposition rate is translatable into increased system productivity and lower cost per unit area of thin films. Optimally achievable rates are limited basically by two factors. The first factor relates to target power loading and the second factor relates to instantaneous deposition rate. With regard to target power loading, the RF or DC power supplied per unit area to the emitting regions of the target is limited by considerations of target integrity. Excessive power loading causes melting or fracture of the target or leads to failure of target bonding. With respect to instantaneous deposition rate, for substrate areas directly over emitting target areas, the instantaneous deposition rate may reach levels inconsistent with desired film morphology, or can lead to excessive substrate heating. Exessive substrate particle bombardment may also occur.

In presently employed cathode sputtering systems or apparatus, the substrate upon which the thin film is to be deposited moves past the target to insure deposition uniformity. In the course of one cycle of linear or rotational motion, each area of the substrate is exposed to substantially identical deposition conditions, on average, leading to uniformity in film thickness and material parameters. A typical prior art arrangement is depicted in the schematic view of FIG. 1. FIG. 1 shows a rectangular target 10 with an emissive plasma region 12 in the shape of a rectangular-shaped picture frame. FIG. 1 also illustrates the rectangular substrate 14 upon which the thin film is being deposited. In FIG. 1 there are shown two positions of the substrate 14. The substrate is shown in solid at position A and is shown in dotted at position B. Substrate motion may be in a single sweep from left to right or from position A to position B. Alternatively, there may also be provided a return pass from position B to position A. Alternatively, multiple passes with many complete cycles may also be used. As the substrate makes its pass relative to the target 10, significant emission of source material occurs only from the plasma area 12. In this regard, it is noted that there are two long legs 16A and 16B, each of which has a width L. These two legs contribute almost all of the material that is being deposited since the substrate does not pass over the shorter end regions.

In the prior art construction illustrated in FIG. 1, it is noted that any given area on the substrate spends most of the deposition time in regions not over the plasma area 12. Thus, the time when significant quantities of sputtered material are received at this given area of the substrate is relatively short in duration compared with the time required for transit from say position A to position B.

The ratio of effective to maximum instantaneous deposition rate may be expressed by a geometric efficiency factor g which is defined as the ratio of the time spent over the plasma emission area (area 12 in FIG. 1) to the total process time. For low values of efficiency factor g, the product throughput is low even for maximum allowable target power. The value of geometric efficiency factor g for the system depicted in FIG. 1 is estimated by computing the ratio of times for a single pass at a particular speed v. Actually, the result is independent of the speed v and the number of passes in a run.

In transit from position A to position B at say speed v, a given small area on the substrate takes time $L/v$ to cross one plasma leg, and time $2 L/v$ to cross both legs. The total time over the plasma is thus expressed by the ratio $2 L/v$. The total time taken for a pass is $(2a+t+d)/v$, where a is the minimum clearance required for uniform sputtering, t is the target width, and d is the substrate width. Each of these parameters is illustrated in FIG. 1.

The geometric efficiency factor is thus $g=2 L/(2+t+d)$. For a typical system, we can set some representative values such as $L=1''$, $a=4''$, $t=5''$ and $d=12''$. By inserting these values into the formula, the geometric efficiency is $g=0.080$. Thus, the effective deposition rate with this prior art arrangement of FIG. 1 is only 8% of the possible maximum instantaneous rate.

Moreover, with the arrangement of FIG. 1, the necessary size of the system is not at all optimized. This thus requires an excessively large vacuum system for the sputtering operation. The critical dimension in this regard shown in FIG. 1 is the dimension W. In the example previously given, a minimum horizontal dimension W of the system of FIG. 1 is the sum of $2a+2d+t$. In the example previously given, this calculates at $W=37''$.

SUMMARY OF THE INVENTION

Accordingly, it is an object of the present invention to provide an improved sputtering cathode system or apparatus for the deposition of thin films and one in which there is provided for uniform film deposition at relatively high deposition rates.

Another object of the present invention is to provide an improved sputtering cathode apparatus characterized by a higher device throughput in comparison with existing systems. The improved device throughput also means lower operating costs.

A further object of the present invention is to provide a planar magnetron sputtering apparatus characterized by an increased effective deposition rate arrived at without increasing maximum local target power loading or instantaneous deposition rate at the substrate.

Still another object of the present invention is to provide an improved cathode sputtering apparatus which requires a small vacuum system associated therewith in comparison with existing apparatus.

To accomplish the foregoing and other objects of this invention, there is provided a sputtering cathode apparatus for the deposition of thin films on a substrate. The apparatus of the present invention produces a uniform film with high deposition rates particularly in comparison with conventional systems. The apparatus of this invention preferably includes a planar sputtering means such as a planar megnetron sputtering system having associated therewith means for exciting the system. The improvement in accordance with the invention is realized by constructing the sputtering cathode apparatus and associated target so that the target has a predetermined plasma sputtering area defining a target area larger than the planar area of the substrate. Moreover, the substrate motion is confined to an area within this defined target area. The predetermined plasma sputtering area includes multiple plasma legs separated by non-emissive regions therebetween. In the disclosed embodiment, the predetermined plasma sputtering area is in the form of a convoluted electron path formed in a closed path loop. By employing a target larger than the substrate and with the use of multiple leg plasma areas, substrate motion for deposition is minimized thus leading to a smaller overall apparatus. Thus, with the sputtering cathode apparatus of this invention, the vacuum system associated therewith is of relatively small dimensions particularly compared with existing systems.

BRIEF DESCRIPTION OF THE DRAWINGS

Numerous other objects, features and advantages of the invention should now become apparent upon a reading of the following detailed description taken in conjunction with the accompanying drawing, in which.

DESCRIPTION OF PREFERRED EMBODIMENT

Figure 1:
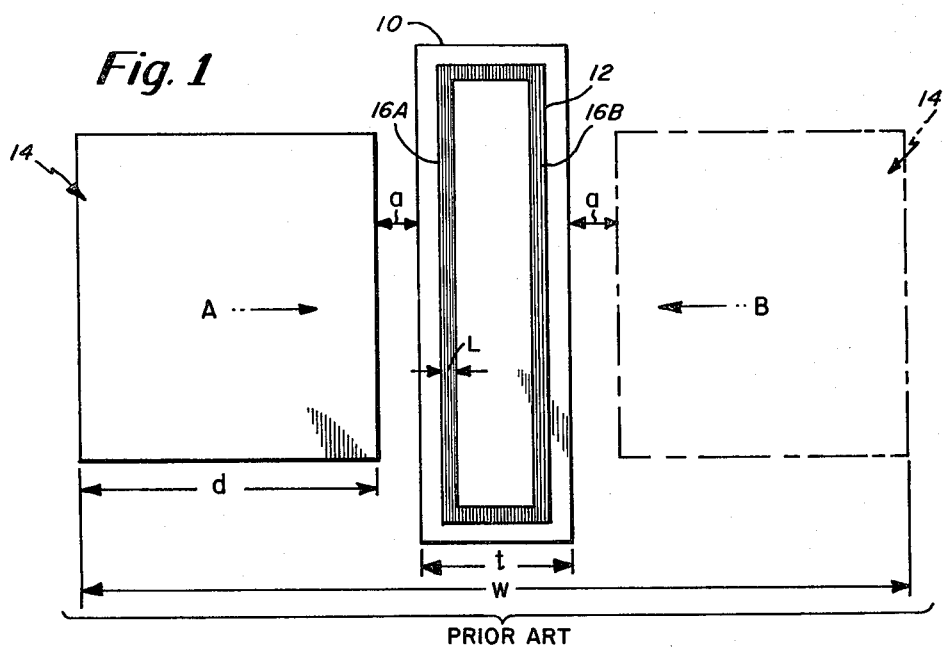
FIG. 1 is a prior art schematic representation of an existing sputtering cathode apparatus used for depositing thin films on the substrate.

FIG. 1 has been discussed hereinbefore in connection with a discussion of the prior art. The construction of FIG. 1 is in the form of a sputtering cathode target having associated therewith a plasma area 12 in the form of a rectangular-shaped picture frame. The substrate is shown in FIG. 1 in two opposite positions of transitions referred to hereinbefore as positions A and B. FIGS. 2-5 illustrate the principles of the present invention.

Figure 2:
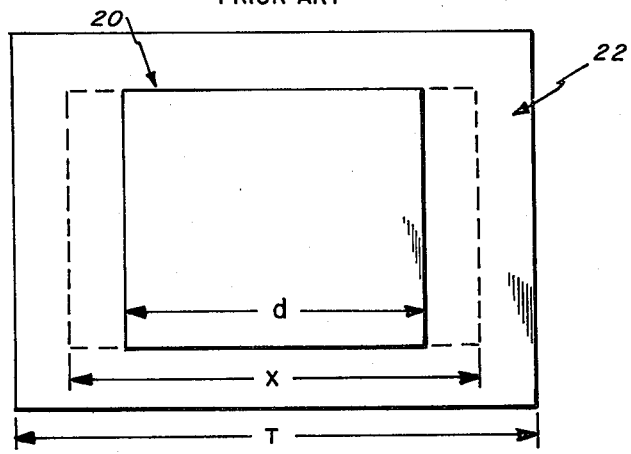
FIG. 2 schematically represents the interrelationship between the sputtering cathode target and associated substrate.

FIG. 2 illustrates the substrate 20 and its geometric relationship with respect to the target 22. It is noted that the target 22 is larger than the substrate 20. Also, the substrate 20 is moved back and forth or left to right and back again within the distance x. It is noted that with this relationship the substrate is always over the general target area. In FIG. 2 the width of the substrate 20 is represented by the dimension d and the width of the target 22 is represented by the dimension T.

Figure 3:
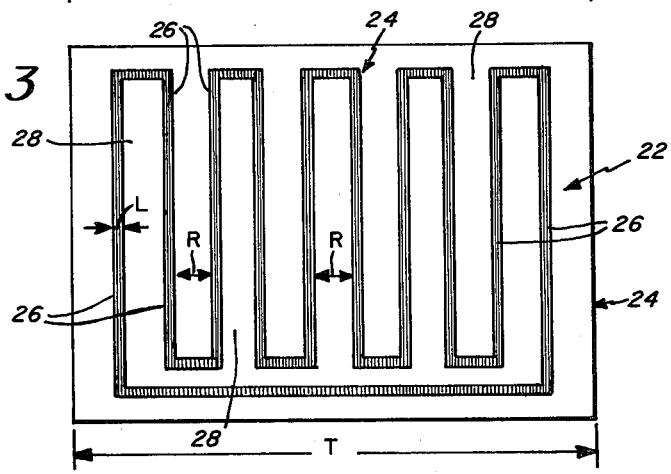
FIG. 3 illustrates the plasma area associated with the magnetron sputtering apparatus of the invention.

It is noted that in FIG. 3 the target 22 is also shown having a width T. However, in FIG. 3 there is also schematically illustrated the plasma area or path 24. In the preferred embodiment illustrated in FIG. 3 this plasma area is magnetically confined to a single convoluted loop. Further details are described hereinafter in connection with the means for establishing the plasma pattern illustrated in FIG. 3.

In FIG. 3 there are ten separate plasma legs 26, each of width L and separated by non-emissive regions 28 each of width R. Although in the illustration of FIG. 3 the dimension R is larger than the dimension L, in practice, both dimensions can each be comparable and, for example, on the order of 0.65". With respect to other dimensions shown in FIGS. 2 and 3, the dimension x may be about equal to $d+4''$. The dimension x shown in FIG. 2 represents the maximum area over which the substrate moves. In FIG. 2 the outer left and right boundaries of this area are shown in dotted with the substrate shown in a centrally disposed position in FIG. 2. The dimension T may be equal to $x+4''$. If it is assumed that the dimension $d=12''$ as in the previous illustration of FIG. 1, then one can solve to determine that $x=16''$ and $T=20''$. Thus, the minimum vacuum chamber size is now 20" rather than 37" as in the example of FIG. 1. This leads to considerable reduction in initial cost for equipment as well as lower direct energy and maintenance costs for support items such as pumping associated with a vacuum system.

Figure 4A:
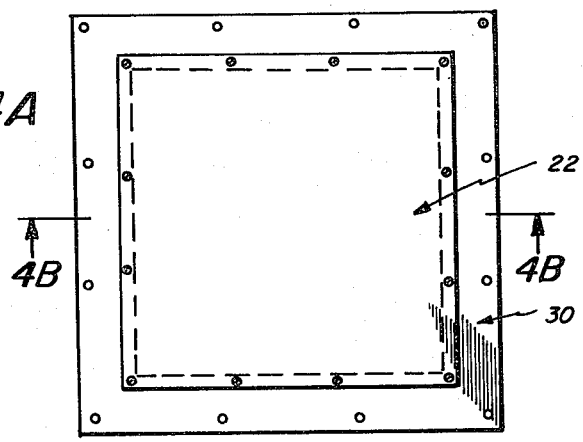
FIGS. 4A and 4B illustrate a more specific design for the planar magnetron sputtering apparatus used in this invention.
Figure 4B:
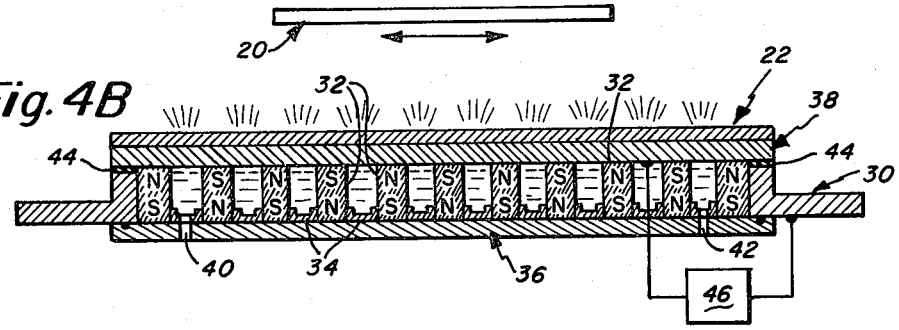
Figure 5:
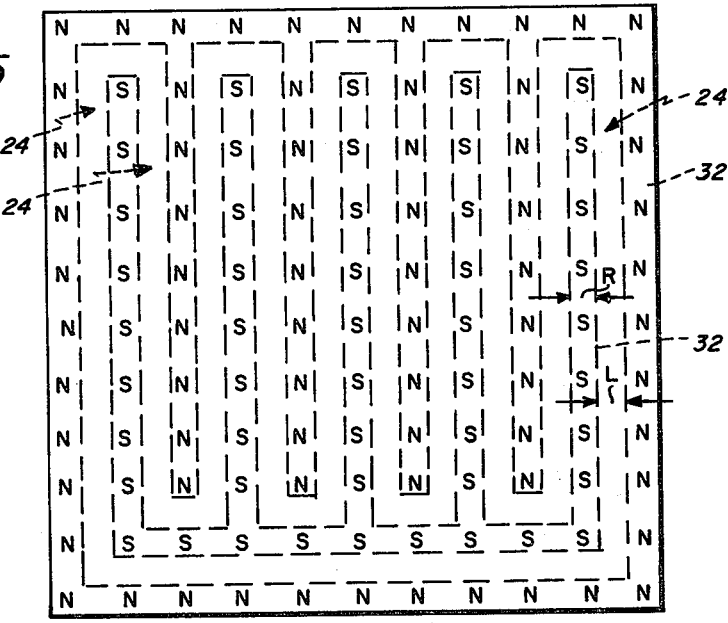
FIG. 5 shows the layout of permanent magnets used in establishing the plasma pattern illustrated in FIG. 3.

FIGS. 4A and 4B illustrate a more specific construction for the plasma magnetron sputtering apparatus of this invention. FIG. 5 schematically illustrates the layout of permanent magnets used in establishing the plasma pattern illustrated in FIG. 3. In FIGS. 4A and 4B there is shown a planar magnetron sputtering apparatus which comprises an aluminum cathode support frame 30 in which are contained a plurality of permanent magnets 32. A series of aluminum brackets 34 may be used to suitably support each of the permanent magnets 32. On the bottom side of the permanent magnet array as illustrated in FIG. 4B, there is provided a cover plate 36 preferably constructed of a magnetic stainless steel. Over the permanent magnet array is an oxygen-free copper backing plate 38 upon which the target 22 is disposed. Also associated with the cover plate 36 is a water inlet port 40 and a water output port 42. As is conventional in planar magnetron sputtering apparatus, cooling water is circulated through the apparatus for maintaining it properly cooled. Also, an electrically insulating ring 44 separates the aluminum cathode frame 30 from the copper plate 38. FIG. 4B also illustrates an RF source 46 essentially coupled between the aluminum cathode frame and the copper plate 38 which is insulated therefrom.

FIG. 4B illustrates the permanent magnets alternating north-south arrangement. FIG. 5 is a plan view illustrating the position of the permanent magnets. In FIG. 5 the plasma region 24 previously mentioned in FIG. 3 is also illustrated. This area is defined as also illustrated in FIG. 4B between adjacent oppositely disposed permanent magnets. The non-emissive region R is thus defined essentially over a permanent magnet also illustrated in FIG. 5.

The geometric efficiency factor g referred to previously in connection with the discussion of FIG. 1 may also be calculated with respect to the embodiment of the invention illustrated in FIG. 3. This geometric efficiency factor $g=L/(L+R)$. In the example previously referred to, this provides a factor of g=0.5. It can be seen that the improvement in the efficiency factor g is by a factor of 6.25. Throughput is thus increased by this order of magnitude. Stated in another way, for equal maximum power loadings in the cathodes of FIGS. 1 and 2, the cathode disclosed in accordance with the present invention completes the film deposition in 1/6.25 or 16% of the time required in comparison with the prior art cathode illustrated in FIG. 1.

In accordance with the present invention it is preferred that the target be larger than the substrate as mentioned previously. Although this means higher initial cost, this is recovered since the same or a higher proportion of material ultimately is deposited on the product (substrate). If desired in connection with expensive materials such as gold, the target material may be installed only in regions of significant sputtering. Recovery procedures may also lead to high overall material utilization factors.

Having described one embodiment of the present invention, it should now be apparent to those skilled in the art that numerous other embodiments are contemplated as falling within the scope of this invention. For example, although the preferred construction is a single convoluted plasma region target, it is understood that the concepts of the invention also pertain to the use of multiple unjoined loops or multiple target geometries. For example, with respect to the construction illustrated in FIG. 3, instead of the single loop disclosed therein, there may be provided five separate rectangular-shaped picture frame loops disposed basically in the pattern illustrated in FIG. 3, but each being separate one from the other. However, the convoluted loop illustrated in FIG. 3 is preferred in that this construction avoids instabilities with regard to mode competition, a situation in which minor variations in power or gas pressure may lead to substantial variations in mode intensities and result in attendant poor uniformity.

We claim:

1. In a sputtering cathode apparatus for the deposition of a thin film on a substrate which is moved relative to the apparatus and including planar sputtering means and means for exciting the planar sputtering means, the improvement comprising a sputtering cathode target associated with said sputtering means, said target having a predetermined plasma sputtering area in the form of a closed convoluted electron path defining a target area larger than the planar area of the substrate, said substrate motion being confined to an area within said defined target area, and said predetermined plasma sputtering area including multiple plasma legs separated by non-emissive regions therebetween.

2. In a sputtering cathode apparatus as set forth in claim 1 wherein the width of a plasma leg is comparable to the width of the non-emissive region.

3. In a sputtering cathode apparatus as set forth in claim 2 wherein both leg and non-emissive region area widths area on the order of 0.65 inch.

4. In a sputtering cathode apparatus as set forth in claim 1 wherein the target width is on the order of 20 inches.

5. In a sputtering cathode apparatus as set forth in claim 1 wherein said plasma sputtering area comprises multiple separate plasma loops.

* * * * *